US012754470B2

(12) United States Patent
Tabbone

(10) Patent No.: US 12,754,470 B2
(45) Date of Patent: Oct. 6, 2026

(54) METHOD FOR ELECTRON BEAM-INDUCED PROCESSING OF A DEFECT OF A MICROLITHOGRAPHIC PHOTOMASK

(71) Applicant: Carl Zeiss SMT GmbH, Oberkochen (DE)

(72) Inventor: Gilles Tabbone, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 395 days.

(21) Appl. No.: 18/226,901

(22) Filed: Jul. 27, 2023

(65) Prior Publication Data

US 2024/0036456 A1 Feb. 1, 2024

(30) Foreign Application Priority Data

Jul. 27, 2022 (DE) ......................... 102022118874.4

(51) Int. Cl.
*G03F 1/20* (2012.01)
*G03F 7/00* (2006.01)
(Continued)

(52) U.S. Cl.
CPC .............. *G03F 1/20* (2013.01); *G03F 7/7065* (2013.01); *G03F 7/70655* (2023.05);
(Continued)

(58) Field of Classification Search
CPC ... H01J 2237/31744; H01J 2237/24585; H01J 2237/04735; H01J 2237/3056;
(Continued)

(56) References Cited

U.S. PATENT DOCUMENTS 6,353,222 B1 3/2002 Dotan
9,721,754 B2 8/2017 Bret et al.
(Continued)

FOREIGN PATENT DOCUMENTS

DE 102017208114 5/2018 ............... G03F 1/74
DE 102020208183 12/2021 ............... G03F 1/74
(Continued)

OTHER PUBLICATIONS

The Office Action issued by the Korean Patent Office for Application No. KR 10-2023-0096638 dated Apr. 29, 2025 (with English Translation).
(Continued)

*Primary Examiner* — Jason L Mccormack
(74) *Attorney, Agent, or Firm* — Fish & Richardson P.C.

(57) ABSTRACT

A method for electron beam-induced processing of a defect of a microlithographic photomask, including the steps of:

a) providing an activating electron beam at a first acceleration voltage (EHT1) and a process gas in the region of a defect of the photomask for the purpose of repairing the defect, and
b) producing at least one image of the photomask, in which the region of the defect is captured at least in part, by providing an electron beam at at least one second acceleration voltage (e.g., EHT2, EHT3, EHT4) which differs from the first acceleration voltage (EHT1), for the purpose of determining a quality of the repaired defect.

20 Claims, 7 Drawing Sheets

(51) Int. Cl.
*H01J 37/22* (2006.01)
*H01J 37/28* (2006.01)
*H01J 37/30* (2006.01)

(52) U.S. Cl.
CPC .. *G03F 7/706837* (2023.05); *G03F 7/706839* (2023.05); *H01J 37/222* (2013.01); *H01J 37/28* (2013.01); *H01J 37/30* (2013.01); *H01J 2237/04735* (2013.01); *H01J 2237/24585* (2013.01)

(58) Field of Classification Search
CPC ............... H01J 2237/00; H01J 2237/02; H01J 2237/30; H01J 2237/26; H01J 2237/28; H01J 2237/222; H01J 2237/1471; G03F 7/706839; G03F 7/706837; G03F 7/70655; G03F 7/7065; G03F 1/80; G03F 1/74; G03F 1/72; G03F 1/20; G23F 4/00; C23F 1/12
USPC .............................. 250/492.3, 306, 307, 311
See application file for complete search history.

(56) References Cited

U.S. PATENT DOCUMENTS

| | | | | |
|---|---|---|---|---|
| 2011/0189593 | A1 | 8/2011 | Ogawa et al. | |
| 2012/0273458 | A1 | 11/2012 | Bret et al. | |
| 2013/0126728 | A1* | 5/2013 | Waiblinger ............... | G03F 1/86 250/307 |
| 2015/0036914 | A1 | 2/2015 | Sekiguchi et al. | |
| 2017/0138725 | A1 | 5/2017 | Kawada et al. | |
| 2018/0284600 | A1* | 10/2018 | Steigerwald .............. | G03F 1/24 |
| 2019/0346769 | A1* | 11/2019 | Hashimoto ............... | G03F 1/86 |
| 2020/0096862 | A1 | 3/2020 | Tolani et al. | |
| 2020/0249564 | A1 | 8/2020 | Budach et al. | |
| 2020/0310245 | A1 | 10/2020 | Kozakai et al. | |
| 2020/0373120 | A1 | 11/2020 | Yuli et al. | |
| 2021/0256687 | A1* | 8/2021 | Girmonsky ........... | G03F 7/7065 |
| 2023/0109566 | A1 | 4/2023 | Rhinow et al. | |
| 2023/0113702 | A1 | 4/2023 | Rhinow et al. | |

FOREIGN PATENT DOCUMENTS

| | | | |
|---|---|---|---|
| KR | 10-2020-0115057 A | 10/2020 | |
| KR | 1020210047356 | 4/2021 | ............... G03F 7/20 |
| KR | 10-2022-0098097 A | 7/2022 | |
| TW | 202217436 | 5/2022 | ............... G03F 1/44 |

OTHER PUBLICATIONS

The Office Action and Search Report issued by the Taiwan Patent Office for Application No. TW 112128014 dated May 30, 2024 (with English Translation).

Notice of Allowance in Korean Appln. No. 10-2023-0096638, mailed on Jan. 27, 2026, 5 pages (with English translation).

* cited by examiner

METHOD FOR ELECTRON BEAM-INDUCED PROCESSING OF A DEFECT OF A MICROLITHOGRAPHIC PHOTOMASK

CROSS-REFERENCE TO RELATED APPLICATION

This application claims priority to German Patent Application DE 10 2022 118 874.4, filed on Jul. 27, 2022.

TECHNICAL FIELD

The present invention relates to a method for electron beam-induced processing of a defect of a microlithographic photomask.

BACKGROUND

The content of the priority application DE 10 2022 118 874.4 is incorporated by reference in its entirety.

Microlithography is used for the production of microstructured component parts, for example integrated circuits. The microlithography process is carried out using a lithography apparatus, which has an illumination system and a projection system. The image of a mask (reticle) illuminated by use of the illumination system is projected here by use of the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, in particular 13.5 nm, are currently under development.

In this case, the microlithographic masks or photomasks themselves have structure dimensions ranging from a few nanometers to several hundred nanometers. The production of such photomasks is very complicated and therefore costly. In particular, this is the case because the photomasks have to be defect-free in order to ensure that a structure produced on the silicon wafer by use of the photomasks exhibits the desired function. In particular, the quality of the structures on the photomask is decisive for the quality of the integrated circuits produced on the wafer by use of the photomask.

It is for this reason that microlithographic photomasks are checked for the presence of defects and found defects are repaired in a targeted manner. Typical defects comprise the lack of envisaged structures and the presence of non-envisaged structures. Such defects can be caused by an etching process proceeded too quickly or developed its effect at a wrong site or not carried out successfully. These defects can be remedied by targeted etching of excess material or targeted deposition of additional material at the appropriate positions; by way of example, this is possible in a very targeted manner by use of electron beam-induced processes (FEBIP, "focused electron beam induced processing").

DE 10 2017 208 114 A1 describes a method for particle beam-induced etching of a photolithographic mask. In this case, a particle beam, in particular an electron beam, and an etching gas are provided at a site on the photolithographic mask to be etched. The particle beam activates a local chemical reaction between a material of the photolithographic mask and the etching gas, as a result of which material is locally ablated from the photolithographic mask.

SUMMARY

Against this background, it is an aspect of the present invention to provide an improved method for electron beam-induced processing of a defect of a microlithographic photomask.

Accordingly, a method is proposed for electron beam-induced processing of a defect of a microlithographic photomask. The method comprises the steps of:

a) providing an activating electron beam at a first acceleration voltage and a process gas in the region of a defect of the photomask for the purpose of repairing the defect, and b) producing at least one image of the photomask, in which the region of the defect is captured at least in part, by providing an electron beam at at least one second acceleration voltage which differs from the first acceleration voltage, for the purpose of determining a quality of the repaired defect.

The at least one image of the photomask produced in step b) is for example produced on the basis of an interaction of the electrons of the electron beam with a material of the photomask. The energy of the electrons of the electron beam depends on the acceleration voltage with which the electron beam (primary beam) is provided. The greater the acceleration voltage, the higher the energy of the electrons. The higher the energy of the electrons, the greater their penetration depth into the material of the photomask and the greater an interaction volume, in which the electrons interact with the material of the photomask. In other words, varying the acceleration voltage allows images of the photomask to be recorded from different depth layers in the photomask.

By producing the at least one image of the photomask by way of the provision of an electron beam at at least one second acceleration voltage, it is consequently possible to acquire information for determining a quality of the repaired defect from a different depth to the one enabled by the first acceleration voltage.

Interactions of the electrons of the electron beam (primary beam) with the material of the photomask for example comprise an interaction of the electrons of the primary beam with atoms of the object to be examined, with secondary electrons being produced. Furthermore, the interactions may also comprise backscattered electrons, for example.

By way of example, the electron beam is scanned over the photomask and/or a part of the photomask.

If a plurality of images of the photomask, in which the region of the defect is captured at least in part, are produced in step b), then the plurality of images are in particular produced in such a way that they capture and/or represent one and the same region of the photomask.

If a plurality of images of the photomask are produced in step b), then this means that each of the plurality of images is produced by the provision of the electron beam at a respective second acceleration voltage. The plurality of second acceleration voltages used to produce the plurality of images in particular are different from one another (i.e., pairwise different) and different from the first acceleration voltage.

The at least one image of the photomask is recorded by use of a scanning electron microscope (SEM), for example. By way of example, the at least one image of the photomask has a spatial resolution of the order of a few nanometers.

By way of example, the method may include a step of determining the quality of the repaired defect.

The repairing of the defect in step a) for example comprises an etching of the defect, within the scope of which material is locally ablated from the photomask, or a deposition of material on the photomask in the region of the defect.

By way of the proposed method, it is possible to better etch away a superfluous structure in the region of the defect during post-processing of the photomask following step b)—i.e., for example by carrying out step a) anew—or a missing structure in the region of the defect can be better augmented. In particular, the proposed method allows edge regions of the defect to be etched away better and more accurately, or a missing structure in the edge region of the defect can be augmented better and more accurately.

By way of example, the microlithographic photomask is a photomask for an EUV lithography apparatus. In this case, EUV stands for "extreme ultraviolet" and denotes a wavelength of the working light of between 0.1 nm and 30 nm, in particular 13.5 nm. Within an EUV lithography apparatus, a beam shaping and illumination system is used to guide EUV radiation onto a photomask (also referred to as "reticle"), which in particular is in the form of a reflective optical element (reflective photomask). The photomask has a structure which is imaged onto a wafer or the like in a reduced fashion by use of a projection system of the EUV lithography apparatus.

By way of example, the microlithographic photomask can also be a photomask for a DUV lithography apparatus. In this case DUV stands for "deep ultraviolet" and denotes a wavelength of the working light of between 30 nm and 250 nm, in particular 193 nm or 248 nm. Within a DUV lithography apparatus, a beam shaping and illumination system is used to guide DUV radiation onto a photomask, which in particular is in the form of a transmissive optical element (transmissive photomask). The photomask has a structure which is imaged onto a wafer or the like in a reduced fashion by use of a projection system of the DUV lithography apparatus.

By way of example, the microlithographic photomask comprises a substrate and a structure formed on the substrate by way of a coating. By way of example, the photomask is a transmissive photomask, in the case of which the pattern to be imaged is realized in the form of an absorbing (i.e., opaque or partly opaque) coating on a transparent substrate. Alternatively, the photomask can also be a reflective photomask, for example, especially for use in EUV lithography. The photomask may also be a mask for nanoimprint lithography (NIL).

By way of example, the substrate comprises silicon dioxide (SiO2), for example fused quartz. By way of example, the structured coating comprises chromium, chromium compounds, tantalum compounds and/or compounds made of silicon, nitrogen, oxygen, molybdenum and/or ruthenium. The substrate and/or the coating may also comprise other materials.

In the case of a photomask for an EUV lithography apparatus, the substrate may comprise an alternating sequence of molybdenum and silicon layers.

Using the proposed method, it is possible to repair a defect of a photomask, in particular a defect of a structured coating of the photomask. In particular, a defect is an (e.g., absorbing or reflecting) coating of the photomask that has been applied incorrectly to the substrate. The method can be used to augment the coating at the sites on the photomask where it is lacking. Furthermore, the coating can be removed using the method from sites on the photomask where it had been applied incorrectly.

The measure of quality for the repaired defect is a quality of the repaired defect in particular. The measure of quality for the repaired defect is a defect parameter in particular. The measure of quality for the repaired defect is for example a degree of correspondence between the repaired defect and a predetermined configuration of the photomask, with great correspondence meaning a high quality of the repaired defect. The measure of quality for the repaired defect of a structured coating of the photomask is for example a degree of correspondence between the repaired defect of the structured coating and a predetermined configuration of the structured coating.

The determination of the quality of the repaired defect includes, for example, a determination of a deviation and/or an extent of a deviation of a parameter determined from the at least one produced image of the photomask from a reference parameter determined from reference data.

By way of example, an image of at least a part of the photomask, in which the defect is captured, in particular captured in full, can be provided and/or produced in step a). By way of example, a geometric shape of the defect in the image can be determined as a repair shape in step a). By way of example, a two-dimensional, geometric shape of the defect is determined. The determined geometric shape of the defect is referred to below as a so-called repair shape. By way of example, the repair shape comprises a number of n pixels. The electron beam is produced at the first acceleration voltage in step a) and for example directed at each of the n pixels of the repair shape.

By way of example, the process gas is a precursor gas and/or an etching gas. By way of example, the process gas can be a mixture of a plurality of gaseous components, which is to say a process gas mixture. By way of example, the process gas can be a mixture of a plurality of gaseous components, of which each only has a certain molecule type.

In particular, alkyl compounds of main group elements, metals or transition elements can be considered as precursor gases suitable for the deposition or for growing of elevated structures. Examples of this include cyclopentadienyl(trimethyl)platinum ($CpPtMe_3$ Me=$CH_4$), methylcyclopentadienyl(trimethyl)platinum ($MeCpPtMe_3$), tetramethyltin ($SnMe_4$), trimethylgallium ($GaMe_3$), ferrocene ($Cp_2Fe$), bisarylchromium ($Ar_2Cr$), and/or carbonyl compounds of main group elements, metals or transition elements, such as, e.g., chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_1$), iron pentacarbonyl ($Fe(CO)_5$), and/or alkoxide compounds of main group elements, metals or transition elements, such as, e.g., tetraethoxysilane ($Si(OC_2H_5)_4$), tetraisopropoxytitanium ($Ti(OC_3H_7)_4$), and/or halide compounds of main group elements, metals or transition elements, such as, e.g., tungsten hexafluoride ($WF_6$), tungsten hexachloride ($WCl_6$), titanium tetrachloride ($TiCl_4$), boron trifluoride ($BCl_3$), silicon tetrachloride ($SiCl_4$), and/or complexes with main group elements, metals or transition elements, such as, e.g., copper bis(hexafluoroacetylacetonate) ($Cu(C_5F_6HO_2)_2$), dimethylgold trifluoroacetylacetonate ($Me_2Au(C_5F_3H_4O_2)$), and/or organic compounds such as carbon monoxide (CO), carbon dioxide ($CO_2$), aliphatic and/or aromatic hydrocarbons, and more of the same.

By way of example, the etching gas may comprise: xenon difluoride ($XeF_2$), xenon dichloride ($XeCl_2$), xenon tetrachloride ($XeCl_4$), steam ($H_2O$), heavy water ($D_2O$), oxygen ($O_2$), ozone ($O_3$), ammonia ($NH_3$), nitrosyl chloride (NOCl) and/or one of the following halide compounds: XNO, $XONO_2$, $X_2O$, $XO_2$, $X_2O_2$, $X_2O_4$, $X_2O_6$, where X is a halide. Further etching gases for etching one or more of the deposited test structures are specified in U.S. patent application Ser. No. 13/103,281 filed on May 9, 2011, issued as U.S. Pat. No. 9,721,754 on Aug. 1, 2017, assigned to Carl Zeiss SMT GmbH, the entire content of which is incorporated by reference.

The process gas may comprise further additional gases, for example oxidizing gases such as hydrogen peroxide ($H_2O_2$), nitrous oxide ($N_2O$), nitrogen oxide (NO), nitrogen dioxide ($NO_2$), nitric acid ($HNO_3$) and other oxygen-containing gases and/or halides such as chlorine ($Cl_2$), hydrogen chloride (HCl), hydrogen fluoride (HF), iodine ($I_2$), hydrogen iodide (HI), bromine ($Br_2$), hydrogen bromide (HBr), phosphorus trichloride ($PCl_3$), phosphorus pentachloride ($PCl_5$), phosphorus trifluoride ($PF_3$) and other halogen-containing gases and/or reducing gases, such as hydrogen ($H_2$), ammonia ($NH_3$), methane ($CH_4$) and other hydrogen-containing gases. These additional gases can be used, for example, for etching processes, as buffer gases, as passivating media and the like.

By way of example, the activating electron beam is provided with the aid of an apparatus which may comprise: an electron source for producing the electron beam at a varying acceleration voltage; an electron beam guiding device (e.g., scanning unit) configured to direct the electron beam at a respective pixel of the repair shape of the photomask; an electron beam shaping device (e.g., electron or beam optics) configured to shape, in particular focus, the electron beam; at least one storage container configured to store the process gas or at least one gaseous component of the process gas; at least one gas provision device configured to provide the process gas or the at least one gaseous component of the process gas at a predetermined gas quantity flow rate to the respective pixel of the repair shape; and at least one detector for detecting secondary electrons and/or backscattered electrons.

By way of example, an electron beam is provided in step a) of the method using a modified scanning electron microscope.

In step a), the activating electron beam activates, in particular, a local chemical reaction between a material of the photomask and the process gas, which leads locally to a deposition of material on the photomask from the gas phase or to a transition of material of the photomask into the gas phase.

In step a), the activating electron beam is successively provided at each pixel of the repair shape, for example using the electron beam guiding device. The activating electron beam remains at each pixel for a predetermined dwell time in order to initiate the chemical reaction between the process gas and the mask material at the location of the respective pixel. By way of example, the dwell time is 100 ns. However, the dwell time may also adopt other values. By way of example, the dwell time of the activating particle beam at each pixel of the repair shape is less than or equal to 500 ns, less than or equal to 400 ns, less than or equal to 300 ns, less than or equal to 200 ns, less than or equal to 100 ns and/or less than or equal to 50 ns.

By way of example, the at least one image of the photomask in step b) of the method is recorded using the same modified scanning electron microscope that is used to provide the activating electron beam in step a) of the method. By way of example, the at least one image of the photomask in step b) of the method is recorded using the same modified scanning electron microscope that is used to record an image of at least a part of the photomask for the purpose of determining the repair shape of the defect in step a).

In step b), the electron beam is guided (scanned) over the photomask or a part of the photomask, for example by use of the electron beam guiding device. The electrons of the electron beam (primary beam) interact with a material of the photomask and for example produce secondary electrons and/or backscattered electrons, which are detected by use of the at least one detector. The at least one image of the photomask is produced on the basis of the captured secondary electrons and/or backscattered electrons.

According to an embodiment, the at least one second acceleration voltage is greater than the first acceleration voltage.

As a result, a greater depth of the photomask than is possible by the application of the first acceleration voltage, which is used during the repair in step b), can be captured when producing the at least one image in step b).

By way of example, the first and second acceleration voltage are each in the range greater than or equal to 0.2 kV, 0.4 kV and/or 0.6 kV. By way of example, the first and second acceleration voltage additionally are each in the range less than or equal to 2 kV, 4 kV, 6 kV, 8 kV and/or 10 kV. By way of example, the first and second acceleration voltage are each located in the range between 0.6 kV and 2 kV or in the range between 0.2 kV and 10 kV.

Furthermore, the first acceleration voltage is located in the range less than 1 kV, for example. By way of example, the second acceleration voltage is located in the range of 1 kV or more.

According to a further embodiment, a plurality of images of the photomask are produced using the electron beam at a corresponding plurality of second acceleration voltages which differ from the first acceleration voltage and from one another, for the purpose of acquiring depth information in relation to a structure of the photomask.

In particular, the same image portion of the photomask is captured in the plurality of images of the photomask. The depth information of the structure of the photomask is acquired in particular in a direction perpendicular to a main plane of extent of the photomask.

By way of example, the structure of the photomask is a structured coating of the photomask.

According to a further embodiment, step b) is carried out in situ in relation to step a).

As a result, the quality of the repaired defect of the photomask can be checked immediately following the repair in step a) and in situ. In particular, it is possible to immediately make a decision as to whether the quality of the repair meets a given quality level (e.g., whether an extent of a deviation of the repaired defect from reference data is less than a predetermined threshold value). By way of example, the photomask can only be output (e.g., discharged) from a processing apparatus (e.g., a scanning electron microscope apparatus) if the determined quality is sufficient.

In particular, the photomask remains at the same location during steps a) and b). By way of example, the photomask also remains in the same position and orientation during steps a) and b). By way of example, the photomask is arranged on a sample stage in order to carry out step a) and also remains on this sample stage during step b).

According to a further embodiment, steps a) and b) are carried out in a vacuum environment and the photomask remains in the vacuum environment between step a) and step b).

Hence, the photomask can be discharged from the vacuum environment depending on a quality determined in step b).

According to a further embodiment, steps a) and b) are carried out using the same scanning electron microscope apparatus, and/or the electron beam at the first acceleration voltage and the electron beam at the at least one second acceleration voltage are produced by the same electron source.

By way of example, the electron source comprises a cathode for releasing electrons and an anode for accelerating the released electrons in the direction of the anode. By way of example, the electrons are accelerated, in the direction of the anode, from the cathode to the anode according to an acceleration voltage applied between the cathode and the anode. By way of example, the electron source comprises an adjustment apparatus for adjusting an acceleration voltage applied between the cathode and the anode. By way of example, the anode has a passage opening in order to provide the accelerated electrons as an electron beam.

According to a further embodiment, the method includes the step of: determining the quality of the repaired defect using an image analysis of the at least one produced image of the photomask and/or on the basis of a comparison of the at least one produced image of the photomask with reference data for the at least one second acceleration voltage.

The reference data for the at least one second acceleration voltage comprise in particular reference data for each of the at least one second acceleration voltage. In other words, separate reference data are provided and/or generated for each of the at least one second acceleration voltage.

In particular, the image analysis comprises a computer-assisted image analysis.

According to a further embodiment, the method includes the step of: generating the reference data using a simulation on the basis of a given model of the photomask, wherein, during the simulation, at least one reference image is produced on the basis of a simulated interaction between an electron beam, which corresponds to the at least one second acceleration voltage, and the given model of the photomask.

In particular, the given model of the photomask corresponds to a defect-free photomask and/or a target configuration of the photomask. By way of example, the given model of the photomask comprises a digital model of the photomask, for example a CAD model of the photomask.

According to a further embodiment, a region outside of the defect is captured in the at least one produced image of the photomask and the method includes the step of: generating the reference data on the basis of an image analysis of the region outside of the defect.

The region outside of the defect is in particular a defect-free and/or non-repaired region of the photomask. The region outside of the defect is in particular a region which is defect-free prior to step a).

In embodiments, a deviation and/or an extent of a deviation of a parameter and/or measurable property, determined from the at least one produced image of the photomask, from a reference parameter or a measurable reference property of reference data is determined during the determination of the quality of the repaired defect. Said deviation and/or the extent of the deviation is for example determined for each of the at least one second acceleration voltage.

The parameter determined from the at least one produced image of the photomask and/or the measurable property determined therefrom is for example a parameter/measurable property of a contour of structures in the at least one produced image of the photomask, a dimension of structures in the at least one produced image of the photomask and/or an intensity profile of the at least one produced image of the photomask. By way of example, the reference parameter and/or the measurable reference property is a parameter/measurable property of a reference contour determined from reference data, a reference dimension and/or a reference intensity profile.

According to a further embodiment, the determination of the quality of the repaired defect includes:

- a determination of a contour of one or more structures in the at least one produced image of the photomask and/or
- a determination of a dimension of the one or more structures on the basis of the determined contour.

A contour of one or more structures for example comprises an edge and/or an outline of the one or more structures of the photomask. Determining a contour of the one or more structures of the photomask for example comprises a fitting of a mathematical function, for example a linear function (e.g., straight line), to the one or more structures of the photomask and/or to portions of the one or more structures of the photomask in the at least one produced image.

Blurred edges and/or boundaries of (e.g., very small) structures can also be captured by determining the contour of the one or more structures of the photomask in the at least one produced image. Blurred edges and/or boundaries may arise on account of very small imaged structures and a limited spatial resolution of the produced image. Dimensions of the one or more structures can be measured more accurately by determining the contours.

The dimension of the one or more structures for example comprises a size (e.g., a width or length) of the corresponding structure or else a spacing between a plurality of the structures.

During the determination of the quality of the repaired defect, a deviation of the determined contour from a reference contour in reference data and/or a deviation of the determined dimension from a reference dimension in reference data are/is determined according to a further embodiment, in particular for each of the at least one second acceleration voltage.

By way of example, the reference data comprise reference images. For example, the reference images are based on a pure simulation. The reference images may also be based on an electron beam application of a reference photomask or a reference region of the photomask to be repaired or the repaired photomask. The reference images may be SEM images, for example, of a reference photomask or a reference region of the photomask to be repaired or the repaired photomask.

During the determination of the quality of the repaired defect, an intensity profile of the at least one produced image of the photomask is determined and a deviation of the determined intensity profile from a reference intensity profile of reference data is determined according to a further embodiment, in particular for each of the at least one second acceleration voltage.

By way of example, the intensity profile is a one-dimensional intensity profile which reproduces the intensity of the corresponding image along a line in the image. In other examples, the intensity profile can also be a two-dimensional intensity profile.

According to a further embodiment, the deviation of the determined intensity profile from the reference intensity profile is determined for a region of the produced image which comprises a contour of one or more structures of the photomask.

As a result, it is possible to detect a change in the intensity profile at a contour, for example a boundary and/or an edge, of the one or more structures.

According to a further embodiment, the determined intensity profile is a one-dimensional or a two-dimensional intensity profile.

According to a further embodiment, an extent of a deviation of a parameter determined from the at least one produced image of the photomask from a reference parameter determined from reference data is determined during the determination of the quality of the repaired defect. The method also comprises the steps of:

- determining whether the determined deviation is less than a predetermined threshold value, and/or
- controlling a human machine interface (HMI) unit to output a communication: "satisfactory" and/or controlling a mask output unit to output the repaired photomask if the determined deviation is less than the predetermined threshold value, and/or
- controlling the HMI unit to output a communication: "unsatisfactory" if the determined deviation is greater than the predetermined threshold value.

Hence, a quality level of the repair of the photomask can be determined on the basis of a determined deviation in relation to reference data.

Outputting the repaired photomask using the mask output unit for example comprises an output of the photomask from a processing apparatus (e.g., a scanning electron microscope apparatus), in which steps a) and b) are carried out. Outputting the repaired photomask for example comprises an output and/or discharge of the photomask from a vacuum environment and/or a vacuum housing, in which steps a) and b) are carried out.

Hence, the repaired photomask can only be output from the processing apparatus (e.g., the scanning electron microscope apparatus), the vacuum environment and/or the vacuum housing if the determined quality level of the repair of the photomask is sufficient and/or satisfactory in relation to a predetermined specification. If the determined quality level is insufficient and/or unsatisfactory in relation to the predetermined specification, however, then the photomask remains in the processing apparatus (e.g., the scanning electron microscope apparatus), in the vacuum environment and/or the vacuum housing. Then, there can be further examination and/or processing of the photomask there.

In particular, the HMI unit is a human machine interface unit. By way of example, the HMI unit comprises a display device, for example a display of a computer, notebook, tablet and/or a smartphone, for outputting a communication in the form of text or an image. In addition or as an alternative, the HMI unit may for example also comprise a loudspeaker for the output of a voice communication.

"A" or "an" in the present case should not necessarily be understood to be restrictive to exactly one element. Rather, a plurality of elements, for example two, three or more, can also be provided. Nor should any other numeral used here be understood to the effect that there is a restriction to exactly the stated number of elements. Instead, unless indicated otherwise, numerical deviations upward and downward are possible.

Further possible implementations of the invention also include combinations, not mentioned explicitly, of features or embodiments described above or hereinafter with respect to the exemplary embodiments. In this case, a person skilled in the art will also add individual aspects as improvements or supplementations to the respective basic form of the invention.

Further advantageous configurations and aspects of the invention are the subject of the dependent claims and also of the exemplary embodiments of the invention that will be described hereinafter. The invention is explained in detail hereinafter on the basis of preferred embodiments with reference to the appended figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1:
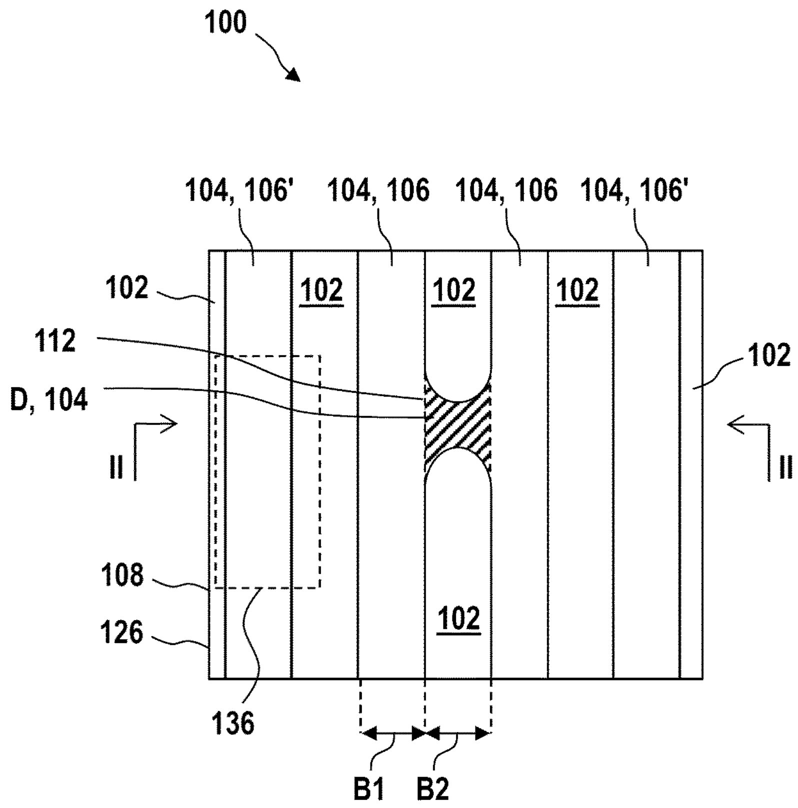
FIG. 1 schematically shows a detail of a microlithographic photomask having a defect in a structured coating according to one embodiment.

FIG. 1 schematically shows a plan view of a detail of a microlithographic photomask 100. In the example shown, the photomask 100 is a transmissive photolithographic mask 100. The photomask 100 comprises a substrate 102. The substrate 102 is optically transparent, especially at the wavelength with which the photomask 100 is exposed. By way of example, a material of the substrate 102 comprises fused quartz.

A structured coating 104 (pattern elements 104) has been applied to the substrate 102. In the example shown, the coating 104 is arranged on the substrate 102 in periodic strips 106, 106'. In other words, the photomask 100 has periodic structures 106, 106'. By way of example, the photomask 100 serves to produce a diffraction grating (grating) by lithography. The photomask 100 may also have a different coating pattern to the coating pattern shown and/or may serve to produce a different component.

In particular, the coating 104 is a coating made of an absorbing material. By way of example, a material of the coating 104 comprises a chromium layer. By way of example, a thickness of the coating 104 ranges from 50 nm to 100 nm. A structure size B1, B2 of the structure 106 formed by the coating 104 on the substrate 102 of the photomask 100 for example ranges from 20 to 200 nm. The structure size B1, B2 may also be greater than 200 nm, for example be of the order of micrometers. The structure size B1, B2 can also be different at different positions of the photomask 100.

In other examples, other materials and other layer thicknesses (for example thinner layer thicknesses, for example "thin EUV mask absorber") to the ones mentioned can also be used for the substrate 102 and the coating 104.

Instead of the transmissive photomask 100 shown in FIG. 1, the photomask 100 can also be a reflective photomask.

Occasionally, defects D can arise during the production of photomasks, for example because etching processes do not run exactly as intended. In FIG. 1, such a defect D is depicted by hatching. This is excess material since the coating 104 was not removed from this region even though the two coating regions 104 next to one another are envisaged as separate in the template for the photomask 100. One could also say that the defect D forms a web. A size of the defect D corresponds to the structure size B2 in this case. Other defects which are smaller than the structure size B2, for example of the order of 5 to 20 nm, are also known. To ensure that a structure produced in a lithography apparatus using the photomask 100 has the desired shape on a wafer and hence the (semiconductor) component produced in this way fulfils the desired function, it is necessary to repair defects, such as the defect D shown in FIG. 1 or else other defects. In this example, it is necessary to remove the web in a targeted manner, for example by particle beam-induced etching.

Figure 2:
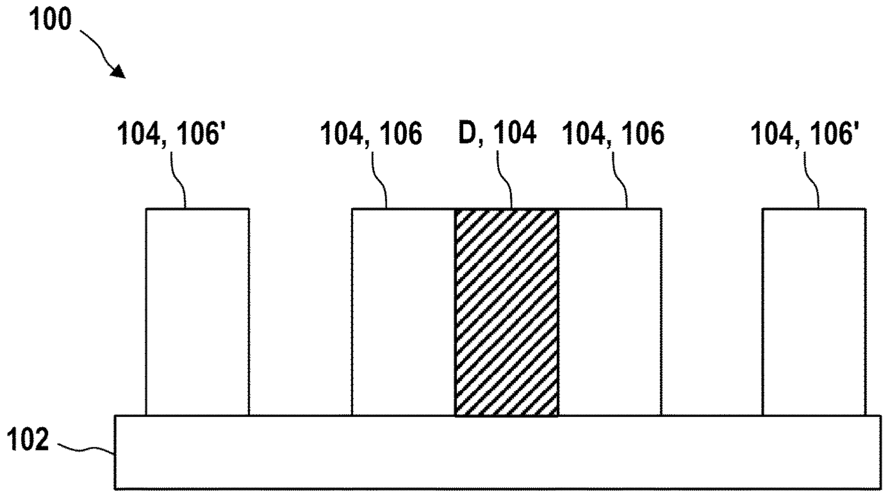
FIG. 2 shows a cross-sectional view of the photomask along the line II-II in FIG. 1.

FIG. 2 shows a cross-sectional view of the photomask 100 along the line II-II in FIG. 1. The coating 104 depicted with hatching is defective and represents the defect D to be repaired.

Figure 3:
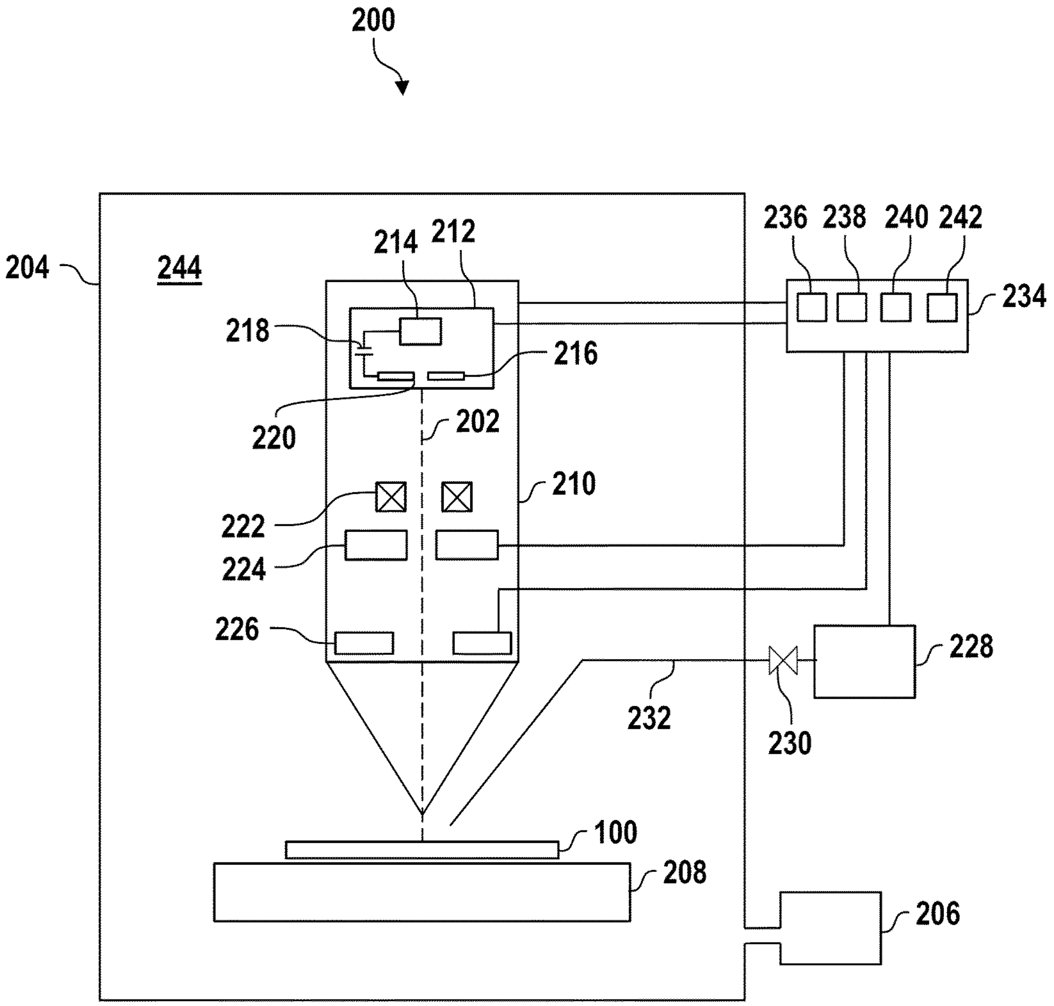
FIG. 3 shows an apparatus for electron beam-induced processing of the defect of the photomask from FIG. 1 according to an embodiment.

FIG. 3 shows an apparatus 200 for electron beam-induced processing of a defect of a microlithographic photomask, for example the defect D of the photomask 100 from FIGS. 1 and 2. FIG. 3 schematically shows the section through a few components of the apparatus 200 which can be used for electron beam-induced repairing, in this case etching, of the defect D of the photomask 100. Moreover, the apparatus 200 can also be used for imaging the photomask, in particular the structured coating 104 of the mask 100 and of the defect D before, during and after the implementation of a repair process.

The apparatus 200 shown in FIG. 3 represents a modified scanning electron microscope 200. In this case, an electron beam 202 is used to repair the defect D. The use of an electron beam 202 as activating particle beam has the advantage that the electron beam 202 substantially cannot damage, or can only slightly damage, the photomask 100, in particular the substrate 102 thereof.

In embodiments, a laser beam for activating a local repair process for the photomask 100 can be used in addition to the electron beam 202 (not shown in FIG. 3).

The apparatus 200 is largely arranged in a vacuum housing 204. A space enclosed by the vacuum housing 204 is kept at a certain gas pressure (vacuum environment 244) by a vacuum pump 206.

By way of example, the apparatus 200 is a repair apparatus (repair tool) for microlithographic photomasks, for example for photomasks for a DUV or EUV lithography apparatus.

A photomask 100 to be processed is arranged on a sample stage 208. By way of example, the sample stage 208 is configured to set the position of the photomask 100 in three orthogonal spatial directions and for example additionally in three orthogonal axes of rotation with an accuracy of a few nanometers.

The apparatus 200 comprises an electron column 210. The electron column 210 comprises an electron source 212 for providing the electron beam 202. By way of example, the electron source 212 has a cathode 214 for releasing electrons and an anode 216 for accelerating the released electrons in the direction of the anode 216. An acceleration voltage is applied at a voltage source 218 between the cathode 214 and the anode 216. Further, the anode 216 for example has a passage opening 220 in order to provide the accelerated electrons as an electron beam 202. An energy of the electrons of the electron beam 202 produced by the electron source 212 can be adjusted by adjusting the acceleration voltage at the voltage source 218.

The electron column 210 also comprises electron or beam optics 222. The electron source 212 produces the electron beam 202 and the electron or beam optics 222 focus the electron beam 202 and direct the latter to the photomask 100 at the output of the column 210. The electron column 210 moreover comprises a deflection unit 224 (scanning unit 224) which is configured to guide (scan) the electron beam 202 over the surface of the photomask 100. Instead of the deflection unit 224 (scanning unit 224) arranged within the column 210, use can also be made of a deflection unit (scanning unit) (not shown) arranged outside of the column 210.

The apparatus 200 furthermore comprises a detector 226 for detecting the secondary electrons and/or backscattered electrons produced in the material of the photomask 100 by the incident electron beam 202. By way of example, as shown, the detector 226 is arranged around the electron beam 202 in ring-shaped fashion within the electron column 210. As an alternative and/or in addition to the detector 226, the apparatus 200 may also contain other/further detectors for detecting secondary electrons and/or backscattered electrons (not shown in FIG. 3).

The apparatus 200 furthermore comprises a gas provision unit 228 for supplying process gas to the surface of the photomask 100. By way of example, the gas provision unit 228 comprises a valve 230 and a gas line 232. The electron beam 230 directed at a location on the surface of the photomask 100 by the electron column 210 can carry out electron-beam induced processing (EBIP) in conjunction with the process gas supplied by the gas provision unit 228 from the outside via the valve 222 and the gas line 232. In particular, said process comprises a deposition and/or an etching of material.

The apparatus 200 moreover comprises a computing apparatus 234, for example a computer, having a control device 236, a production device 238, a determination device 240 and an output device 242. In the example of FIG. 3, the computing apparatus 234 is arranged outside of the vacuum housing 204.

The computing apparatus 234, in particular the control device 236, serves to control the apparatus 200. By way of example, the control device 236 controls the provision of the electron beam 202 by controlling the electron column 210. In the process, the control device 236 inter alia controls the setting of the acceleration voltage of the voltage source 218, and hence the energy of the primary electron beam 202. Furthermore, the control device 236 controls the guidance of the electron beam 202 over the surface of the photomask 100 by driving the scanning unit 224. Moreover, the computing apparatus 234 controls the provision of the process gas by controlling the gas provision unit 228.

Moreover, the computing apparatus 234, in particular the production device 238, receives measurement data from the detector 226 and/or other detectors of the apparatus 200 and produces images 108, 110 (FIGS. 1 and 4) from the measurement data, which images can be displayed on a monitor (not shown). Moreover, images 108, 110 produced from the measurement data can be stored in a memory unit (not shown) of the computing apparatus 234. By way of example, a spatial resolution of the produced images 108, 110 is of the order of a few nanometers.

To prepare a repair of the photomask 100, the apparatus 200 (in particular the computing apparatus 234 and/or the production device 238) is configured in particular to produce at least one image 108 of at least one part of the photomask 100 from measurement data of the detector 226 and/or other detectors of the apparatus 200. FIG. 1 illustrates an image 108 which was produced from measurement data acquired prior to the repair of the defect D.

Figure 4:
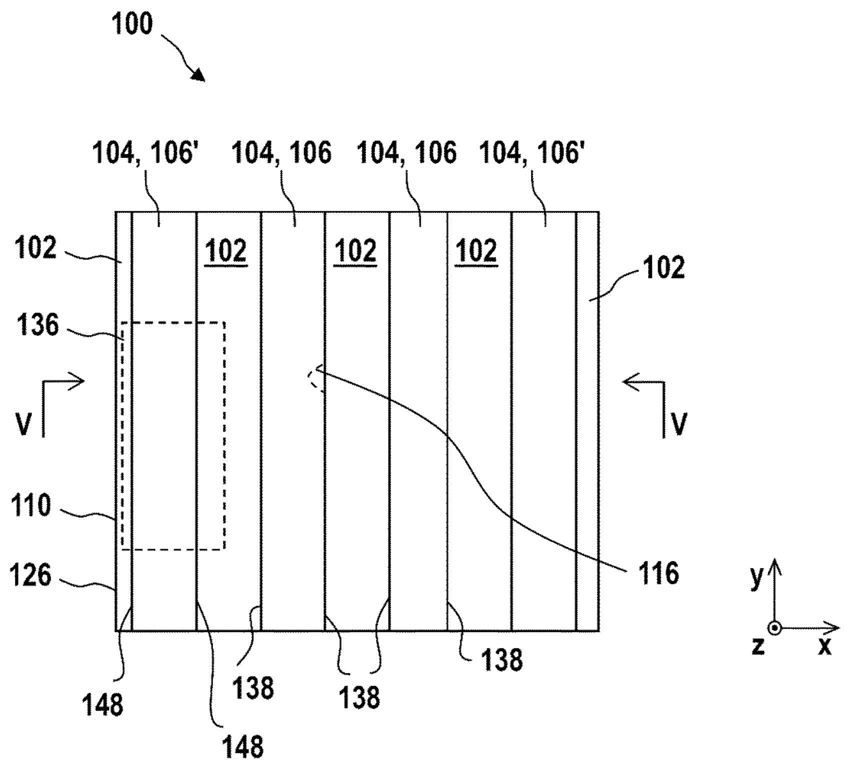
FIG. 4 shows a view similar to FIG. 1, wherein the defect has been repaired using the apparatus from FIG. 3.

To check the repaired photomask 100 and in particular the structured coating 104 of the photomask 100, the apparatus 200 (in particular the computing apparatus 234 and/or the production device 238) is configured in particular to produce at least one image 110 of at least one part of the photomask 100 from measurement data of the detector 226 and/or other detectors of the apparatus 200. FIG. 4 illustrates an image 110 which was produced from measurement data acquired post repair of the defect D.

The computing apparatus 234, in particular the determination device 240, is configured to recognize a defect D (FIG. 1) in an image 108 produced prior to the repair, to locate said defect and to determine a geometric shape 112 (repair shape 112) of the defect D. The determined geometric shape 112 of the defect D, which is to say the repair shape 112, is a two-dimensional geometric shape for example.

The computing apparatus 234, in particular the determination device 240, is also configured to determine a quality of the repaired defect D in an image 110 produced post repair of the defect D.

A method for electron beam-induced processing of a defect of a microlithographic photomask, for example the defect D of the photomask 100 shown in FIGS. 1 and 2, is described hereinbelow with reference to FIGS. 4 to 11.

In a first step S1 of the method, there is provision of an activating electron beam 202 at a first acceleration voltage EHT1 and a process gas in the region 112 of a defect D of the photomask 100 for the purpose of repairing the defect D.

The defect D of the structured coating 104 of the photomask 100 (FIGS. 1 and 2) is for example repaired using the apparatus 200 shown in FIG. 3. To this end, an image 108 of at least a part of the photomask 100 is recorded, a geometric shape of the defect D is determined in the image 108 as a repair shape 112 and the repair shape 112 is divided into a plurality of pixels. Thereupon, the photomask 100 is scanned in the region 112 of the defect D by use of the electron beam 202 and under provision of the process gas so that the defect D, the geometric shape of which is the repair shape 112, is processed and rectified. In this case, the activating electron beam 202 is successively directed at each of the pixels of the repair shape 112. The electron beam 202 dwells at each of the pixels of the repair shape 112 for a predetermined dwell time. In this case, a chemical reaction of the process gas is activated at each of the pixels of the repair shape 112 by way of the electron beam 202. By way of example, the process gas comprises an etching gas. By way of example, the chemical reaction leads to volatile reaction products with the material of the defect D to be etched arising, which are at least partly gaseous at room temperature and which can be pumped away using a pump system (not shown). By way of example, the photomask 100 is scanned in the region 112 of the defect D which corresponds to the pixels of the repair shape 112 over a multiplicity of repetition cycles. In some implementations, to (completely) remove the coating 104 (FIGS. 1 and 2) in the region of the defect D, 100, 1000, 10 000, 100 000 or one million repetition cycles, for example, are required at each pixel of the repair shape 112. The values mentioned above are merely examples, other values can also be used. The number of repetition cycles can depend on, e.g., the thickness and/or the material composition of the defect D.

Figure 5:
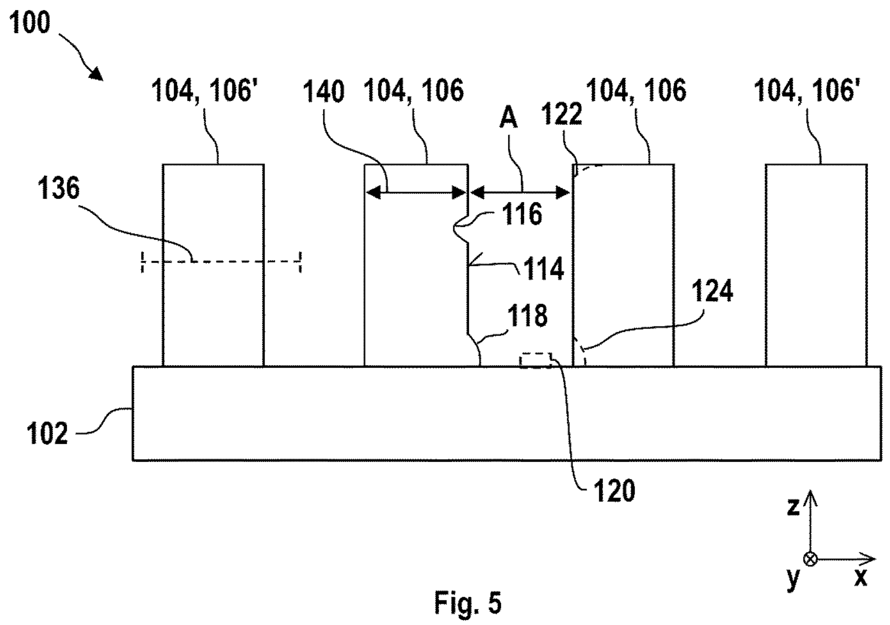
FIG. 5 shows a cross-sectional view of the photomask along the line V-V in FIG. 4.

FIGS. 4 and 5 show the result of a repair of the photomask 100 shown in FIGS. 1 and 2. In this case, FIG. 4 shows a plan view of the repaired photomask 100 and FIG. 5 shows a cross-sectional view of the repaired photomask 100 along the line V-V in FIG. 4.

The repair removed the coating 104, drawn with hatching in FIGS. 1 and 2, in the region of the defect D. However, during such a repair, it may be the case that it is not only the defect D itself that is removed, but that further structures 106 of the coating 104 of the photomask 100 were undesirably modified. By way of example, FIG. 5 shows that portions of a side wall 114 of a coating structure 106 were also modified during the repair of the defect D. FIG. 5 illustrates damage to the side wall 114 in the form of a recess 116 and a projection 118 (e.g., an incorrectly remaining protruding foot portion 118). By way of example, further flawed repairs of the defect D and/or flawed modifications of a desired structure 106 of the photomask 100, which are not shown in FIG. 5 or only shown using dashed lines, may also comprise erroneously remaining residual material 120 in a base portion of the defect D. Moreover, incorrectly rounded-off corners 122 of the desired structure 106 or undercuts 124, for example, may also occur. Although not shown in FIG. 5, damage to the side wall 114 of the desired structure 106 may also be in the form of the side wall 114 having an unwanted inclination (i.e., a deviation from a vertical orientation in FIG. 5).

Such unwanted modifications to the structures 106 of the photomask 100 during the repair of defects D may lead to the repaired photomask 100 not meeting specified quality requirements. In particular, it is advantageous to examine the repaired photomask 100 for the presence of such unwanted modifications of the structures 106. It is particularly advantageous if the photomask 100 remains in the apparatus 200 (FIG. 3) to this end, for example within the vacuum housing 204 and/or on the sample stage 208 of the apparatus 200.

In a second step of the method, at least one image 110 (FIG. 4) of the photomask 100 which at least partially captures the region 112 of the defect D (FIG. 1) is produced with the aid of an electron beam 202 scan, in order to determine a quality of the repaired defect D. The acceleration voltage EHT1 to EHT4 of the voltage source 218 (FIG. 3), and hence the energy of the electrons in the electron beam 202, is suitably set to this end.

Figure 6:
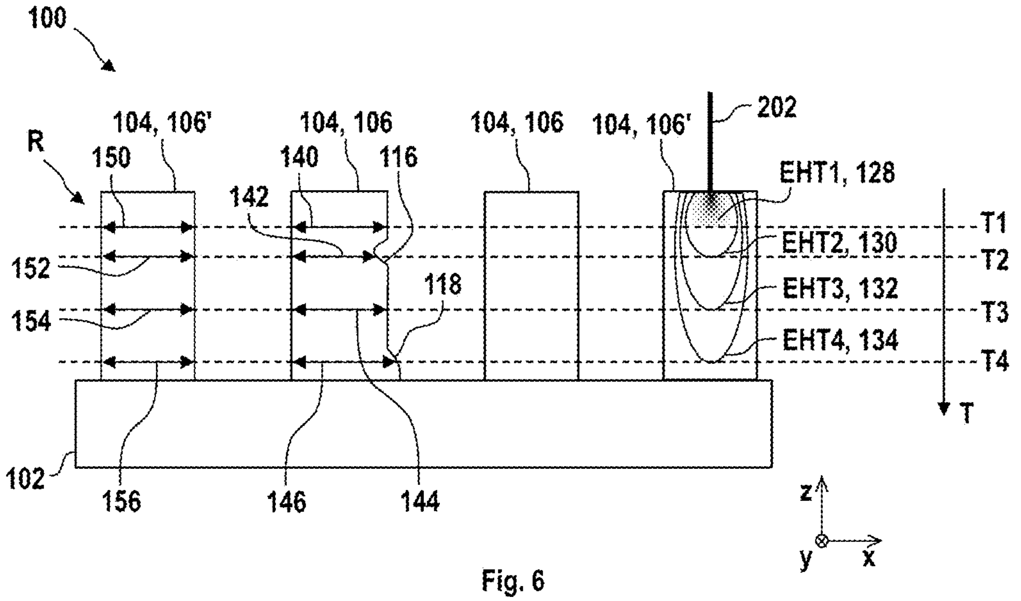
FIG. 6 shows a view similar to FIG. 5, wherein dimensions of the structured coating post repair are illustrated.

FIG. 6 illustrates an interaction of the electrons of the electron beam 202 with a material of the photomask 100. The greater the acceleration voltage EHT1 to EHT4, and hence the greater the energy of the electron beam 202, the greater the penetration depth T of the electron beam 202 into the material of the photomask 100. Moreover, a size of an interaction volume 128-134, in which the electrons of the electron beam 202 interact with the material of the photomask 100, also increases with increasing acceleration voltage EHT1 to EHT4. By way of example, FIG. 6 illustrates four different acceleration voltages EHT1, EHT2, EHT3 and EHT4, at which the electron beam 202 was provided. In this case, the following applies: EHT4 is greater than EHT3, EHT3 is greater than EHT2 and EHT2 is greater than EHT1. As is evident from FIG. 6, a penetration depth T1, T2, T3 and T4 of the respective electron beam 202 into the material of the photomask 100 increases with increasing acceleration voltage EHT1, EHT2, EHT3 and EHT4. Moreover, a size of an interaction volume 128, 130, 132, 134 also increases with increasing acceleration voltage EHT1, EHT2, EHT3 and EHT4. By way of example, the activating electron beam 202 is provided in step S1 at a first acceleration voltage EHT1.

By way of example, the at least one image 110 of the photomask 100 is produced in step S2 using an electron beam 202 at at least one second acceleration voltage EHT2, EHT3 and EHT4, which is greater than the first acceleration voltage EHT1. In the example shown, four images of the photomask 100, which are similar to the image 110, are produced in step S2 using an electron beam 202. In this case, a first image (not shown) is recorded for example at an acceleration voltage EHT1, which is to say at the same acceleration voltage EHT1 that is used in step S1 for repairing the defect D. Furthermore, for example, a second image (not shown) is recorded at an acceleration voltage EHT2, a third image (not shown) is recorded at an acceleration voltage EHT3 and a fourth image 110 (FIG. 4) is recorded at an acceleration voltage EHT4.

In some implementations, the acceleration voltages EHT1 to EHT4 are selected such that the penetration depth T1 is near the top portion of the coating 104 and/or the structure 106, T4 is near the bottom portion of the coating 104 and/or the structure 106, and T2 and T3 are located between the depths T1 and T4 such that the depths T1 to T4 is distributed across substantially the entire depth of the coating 104 and/or the structure 106. This allows the apparatus 200 to detect defects that may occur at any depth of the coating 104 and/or the structure 106.

In some implementations, when a new photomask 100 is loaded into the apparatus 200, the values of EHT1, EHT2, EHT3, and EHT4 are, for example, selected based on a table of values stored in a memory. Alternatively, the values of EHT1, EHT2, EHT3, and EHT4 are, for example, determined automatically by the control device 236.

By producing a plurality of images of the photomask 100, which are similar to the image 110 in FIG. 4, using different acceleration voltages EHT1 to EHT4, it is possible to acquire depth information about the coating 104 and the structures 106 formed by the coating 104, as illustrated in FIG. 6. For example, using different acceleration voltages EHT1 to EHT4, it is possible to acquire information about the coating 104 and the structures 106 formed by the coating 104 at various depths, such as the lateral dimensions of the coating 104 and the structures 106 at various depths, and/or the depths of defects formed in the coating 104 and the structures 106. The lateral dimensions of the coating 104 and the structures 106 refer to the dimensions of the coating 104 and the structure 106 measured along a direction parallel to the surface of the substrate 102. In particular, the depth T is perpendicular to a main plane of extent of the photomask 100, with the main plane of extent of the photomask 100 being located in an XY-plane (FIG. 4). By way of example, the erroneous recess 116 (FIG. 6) in the side wall 114 of the structure 106 situated at a depth T2 can be detected by applying the acceleration voltage EHT2. Furthermore, for example, the erroneous projection 118 of the structure 106 situated at a depth T4 can be detected by applying the acceleration voltage EHT4.

Reference data R for the at least one second acceleration voltage EHT2, EHT3, EHT4 are generated in a third step S3 of the method, in order to compare the at least one produced image 110 of the photomask 100 with the reference data R. In the example shown, reference data R are generated for each of the acceleration voltages EHT1, EHT2, EHT3, EHT4. By way of example, the reference data R comprise reference images, reference dimensions (150 to 156 in FIG. 6) and reference intensity profiles (170 to 174 in FIG. 8).

By way of example, the reference data R can be produced using a simulation on the basis of a given model (not shown) of the photomask 100 (i.e., a template for manufacturing the photomask 100). During the simulation, a reference image based on a simulated interaction of an electron beam which corresponds to the respective acceleration voltage EHT1, EHT2, EHT3, EHT4 with the given model of the photomask 100 is produced for each of the acceleration voltages EHT1, EHT2, EHT3, EHT4, for example.

By way of example, the reference data R can also be produced from an actually recorded image of the photomask 100, for example the image 110, if a region 136 (FIGS. 4 and 5) outside of the defect D is captured in the produced image 110 of the photomask 100. Then, the reference data R can be produced on the basis of an image analysis of the region 136. By way of example, the region 126 of the produced image 110 comprises a plurality of periodic, strip-shaped structures 106, 106', with the defect D being present only between two of the strip-shaped structures 106 (FIG. 1). Accordingly, the other structures 106' can be used as reference structures.

In a fourth step S4 of the method, a quality of the repaired defect D is determined using an image analysis of the at least one produced image 110 of the photomask 100 and/or on the basis of a comparison of the at least one produced image 110 of the photomask 100 with the reference data R for the at least one second acceleration voltage EHT2, EHT3, EHT4.

In the example shown, the quality of the repaired defect D is determined by an image analysis of each of the four images of the photomask 100, for example the image 110, produced in accordance with the acceleration voltages EHT1, EHT2, EHT3 and EHT4. In this case, a comparison is carried out between each of the four produced images or parameters derived therefrom and corresponding reference data R for the acceleration voltages EHT1, EHT2, EHT3, EHT4.

In a first embodiment of the fourth step S4, a contour 138 of one or more structures 106, 106' is determined in the produced images of the photomask 100, for example in the image 110. FIG. 4 illustrates such contours 138 of the coating structures 106, 106'. In contrast to FIG. 4, the structures 106, 106', which for example are of the order of a few nanometers to several hundred nanometers, are usually (very) blurry in a real image 110. Outlines and/or boundaries of the structures 106, 106' can be better identified by determining the contours 138, for example by fitting lines to blurred boundaries of the structures 106, 106'.

In the first embodiment of step S4, dimensions 140 to 146 (FIG. 6) of the structures 106 are subsequently measured on the basis of the determined contour 138. By way of example, a structure width 140 is measured in the image produced for the acceleration voltage EHT1, a structure width 142 is measured in the image produced for the acceleration voltage EHT2, a structure width 144 is measured in the image produced for the acceleration voltage EHT3 and a structure width 146 is measured in the image 110 produced for the acceleration voltage EHT4. Hence, the structure width 140 to 146 of the structure 106 is determined for different depths T1 to T4 of the structure 106.

In the example shown, the dimension is a structure width 140-146 of the structure 106. In other examples, the dimension can also comprise, in addition or in place of a structure width 140 to 146, a distance A between two structures 106, as illustrated in FIG. 5.

Moreover, reference contours 148 (FIG. 4) and reference dimensions 150 to 156 (FIG. 6) are determined in the reference data R generated in step S3 for each of the acceleration voltages EHT1 to EHT4.

Figure 7:
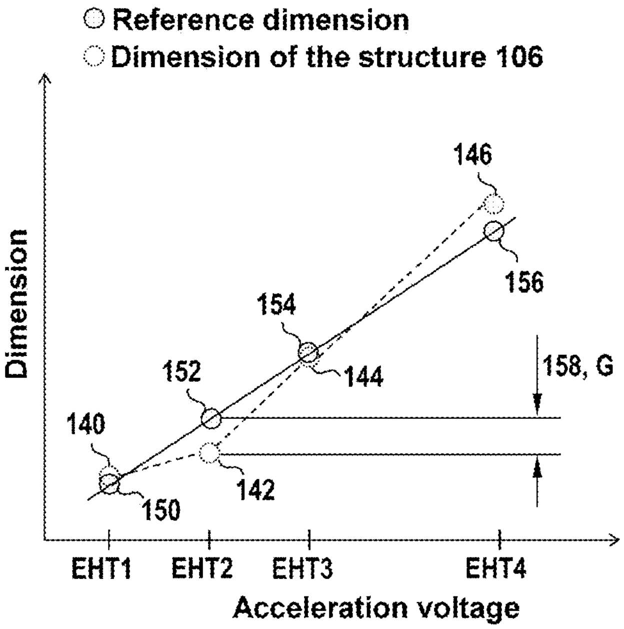
FIG. 7 shows deviations of the dimensions of FIG. 6 in comparison with reference dimensions.

Thereupon, the dimensions 140 to 146 of the structure 106 are compared accordingly with the reference dimensions 150 to 156, as shown in FIG. 7. In particular, a deviation of the dimension 140 to 146 of the structure 106 from the corresponding reference dimension 150 to 156 is determined for each of the four acceleration voltages EHT1 to EHT4 (by way of example, the deviation 158 at the acceleration voltage EHT2 in FIG. 7 is provided with a reference sign).

A level of quality of the repaired defect D is determined on the basis of the measured deviations 158 (FIG. 7), for example a size G of a respective deviation 158. By way of example, the quality level is higher, the smaller the size G of the deviations 158.

Instead of or in addition to the reference dimensions 150 to 156 which are illustrated in the figures and measured directly in the produced image (e.g., in image 110 in FIG. 4) for structures 106' which are not impaired by the defect D, reference dimensions can also be measured in simulated images which are based on a given model of the photomask 100.

Figure 8:
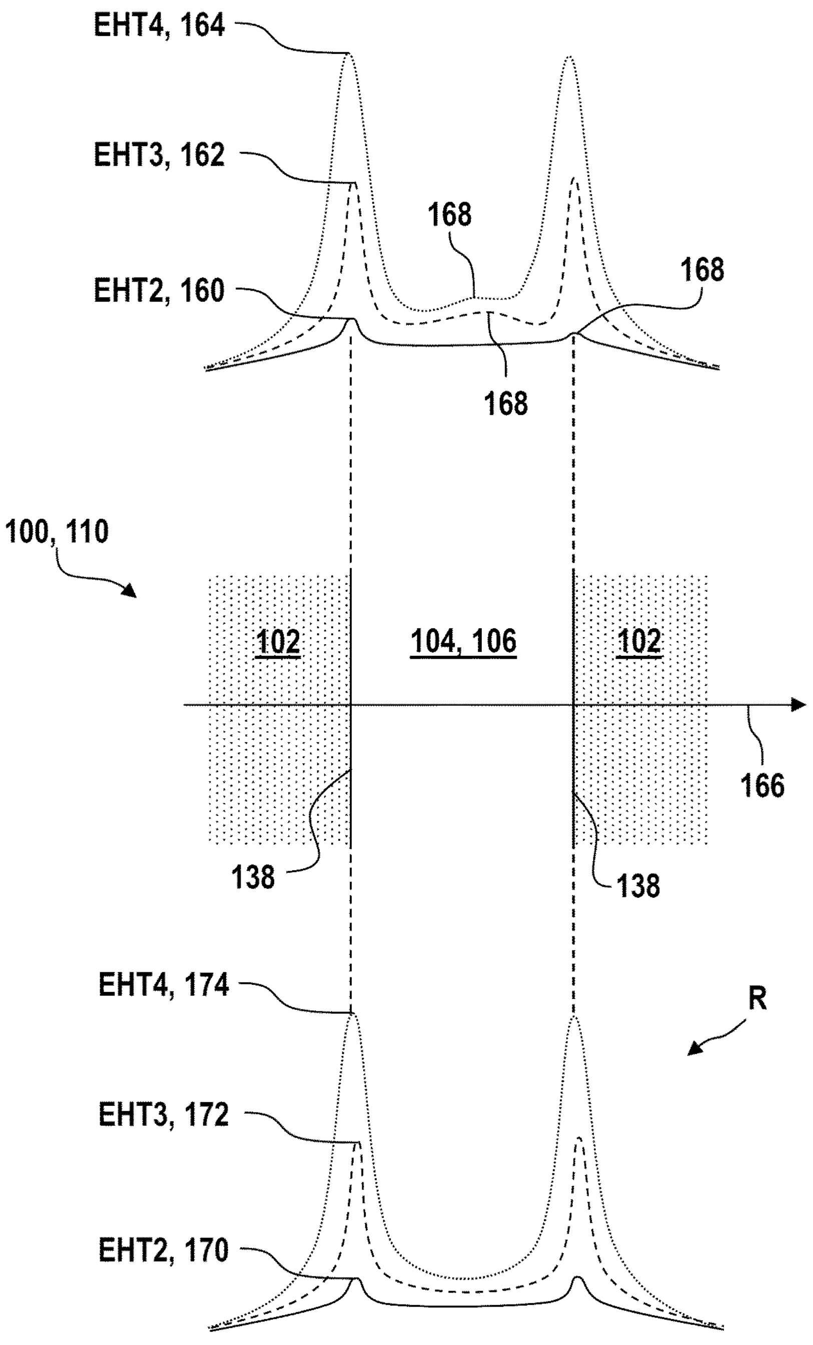
FIG. 8 shows one-dimensional intensity profiles of an image of the photomask from FIG. 4 (top) in comparison with reference intensity profiles (bottom)

In a second embodiment of the fourth step S4, an intensity profile 160, 162, 164 (FIG. 8) of each produced image of the photomask 100 (e.g., image 110), which is to say for each acceleration voltage EHT1 to EHT4, is determined when determining the quality of the repaired defect D. FIG. 8, top, shows by way of example corresponding intensity profiles 160, 162, 164 for the acceleration voltages EHT2, EHT3 and EHT4. Although not shown in FIG. 8, an intensity profile may also be determined for the acceleration voltage EHT1.

In the example shown, the intensity profiles 160, 162, 164 are one-dimensional intensity profiles, which reflect the intensity of the corresponding image (e.g., image 110) along a line 166 (FIG. 8). The center of FIG. 8 shows a detail of the photomask 100 in the image (e.g., image 110) with the coating 104, which is to say the structure 106, framed by the substrate 102. Moreover, the line 166 along which the intensity is determined is plotted. Two-dimensional intensity profiles can also be determined in other examples.

The intensity profiles 160, 162, 164 each have maxima in the region of the contours 138 of the structure 106. Moreover, deviations 168 of the intensity profiles 160, 162, 164 are plotted in FIG. 8.

Figure 9:
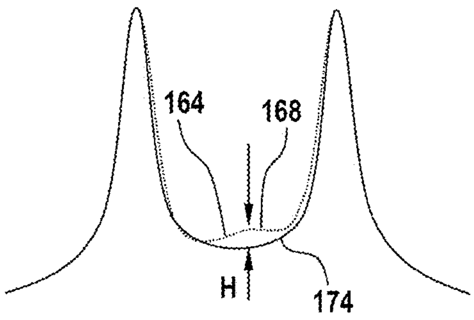
FIG. 9 shows a detail of a comparison of one of the intensity profiles from FIG. 8 with a reference intensity profile.

Furthermore, reference intensity profiles 170, 172, 174 are determined for each of the acceleration voltages EHT2 to EHT4 (or EHT1 to EHT4) in the reference data R generated in step S3. Thereupon, deviations 168 of the generated intensity profiles 160 to 164 from the reference intensity profiles 170 to 174 of the reference data R are determined accordingly. By way of example, FIG. 9 shows a deviation 168 of the intensity profile 164 from the reference intensity profile 174 for the acceleration voltage EHT4.

Depth information regarding the structure 106 is obtained for different depths T1 to T4 (FIG. 6) by determining the intensity profiles 160 to 164 for the various acceleration voltages EHT2 to EHT4 (or EHT1 to EHT4) and accordingly the deviations of these intensity profiles 160 to 164 from reference intensity profiles 170 to 174 for the different acceleration voltages. For example, information about the structure 106 at various depths T1 to T4 can be obtained by determining the intensity profiles 160 to 164 for the various acceleration voltages EHT2 to EHT4 (or EHT1 to EHT4), and determining the deviations of these intensity profiles 160 to 164 from reference intensity profiles 170 to 174 for the various acceleration voltages.

A size H (FIG. 9) of a respective deviation 168 can be determined. A level of quality of the repaired defect D is determined on the basis of the determined deviations 168, for example the size H. By way of example, the quality level is higher, the smaller the size H of the deviation(s) 168.

Figure 10:
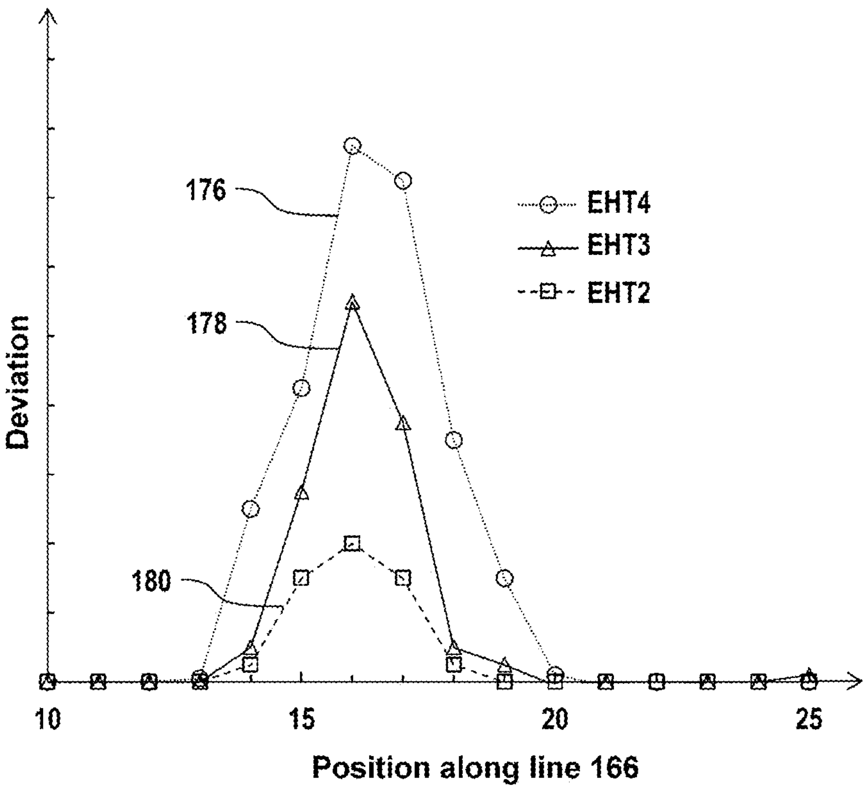
FIG. 10 illustrates deviations of the intensity profiles from the reference intensity profiles of FIG. 8 in the form of graphs.
Figure 11:
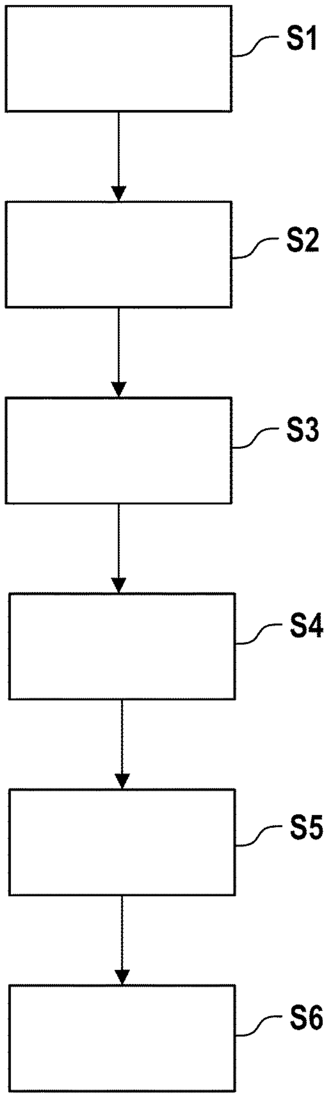
FIG. 11 shows a flowchart of a method for electron beam-induced processing of a defect of the photomask from FIGS. 1 and 4 according to an embodiment.

FIG. 10 shows graphs 176, 178, 180 which represent the size H of the deviations 168 as a function of a position along the line 166 (FIG. 8, center). In particular, the graph 176 describes the size H of the deviation 168 of the intensity profile 164 from the reference intensity profile 174 (i.e., for the acceleration voltage EHT4) as a function of the position along the line 166. Furthermore, the graph 178 describes the size H of the deviation 168 of the intensity profile 162 from the reference intensity profile 172 (i.e., for the acceleration voltage EHT3) as a function of the position along the line 166. Moreover, the graph 180 describes the size H of the deviation 168 of the intensity profile 160 from the reference intensity profile 170 (i.e., for the acceleration voltage EHT2) as a function of the position along the line 166.

The first and second embodiment of step S4 can also be combined with one another such that dimensions 140 to 146 of the structures 106 can be measured and compared with reference dimensions 150 to 156 and also intensity profiles 160 to 164 can be determined and compared with reference intensity profiles 170 to 174 in one image (e.g., image 110 in FIG. 4).

When determining the quality of the repaired defect D, an extent of a deviation of a parameter determined from the at least one produced image 110 of the photomask 100 (e.g., contour 138, dimensions 140 to 146, intensity profiles 160 to 164) from a reference parameter determined from reference data (e.g., reference contour 148, reference dimensions 150 to 156, reference intensity profiles 170 to 174) can be determined.

Whether the determined deviation is smaller than a predetermined threshold value is determined in a fifth step S5 of the method. Then, an output device 242 (HMI unit) can be controlled to output a communication: "satisfactory" and/or a mask output unit can be controlled to output the repaired photomask 100 if the determined deviation is smaller than the predetermined threshold value.

By way of example, the communication: "satisfactory" is output by an output device 242 of the apparatus 200 (FIG. 3). By way of example, the output device 242 has a human machine interface (HMI), for example a display unit and/or a loudspeaker for outputting the communication.

The repaired photomask 100 is output and/or discharged from the vacuum housing 204 of the apparatus 200 by, for example, a mask output unit (not shown) of the apparatus 200.

In a sixth step S6 of the method, the HMI unit 242 is controlled to output a communication: "unsatisfactory" if the determined deviation is greater than or equal to the predetermined threshold value.

By way of example, the communication: "unsatisfactory" is also output by the output device 242 of the apparatus 200 (FIG. 3).

In step S6, the photomask 100 is in particular not output and/or discharged from the vacuum housing 204 of the apparatus 200, but remains in the vacuum housing 204 for further examination and/or for post-processing.

Advantageously, it is consequently possible to determine a level of quality of the repair of the defect D before the photomask 100 is discharged from the apparatus 200, for example from the vacuum housing 204.

In some implementations, the computing apparatus 234 can be implemented using one or more computers that include one or more one or more data processors configured to execute one or more programs that include a plurality of instructions according to the principles described above. The control device 236, the production device 238, the determination device 240, and the output device 242 can be implemented in hardware and/or software, and can share one or more components.

In some implementations, the processing of data described above can be performed by the computing apparatus 234, in particular by the determination device 240. For example, the processing of data can include determining the quality of the repaired defect using an image analysis of the at least one produced image of the photomask and/or on the basis of a comparison of the at least one produced image of the photomask with reference data for the at least one second acceleration voltage. The processing of data can include generating reference data using a simulation on the basis of a given model of the photomask. The processing of data can include, during the simulation, producing at least one reference image on the basis of a simulated interaction between an electron beam, which corresponds to the at least one second acceleration voltage, and the given model of the photomask. The processing of data can include generating the reference data on the basis of an image analysis of the region outside of the defect. The processing of data can include determining a contour of one or more structures in the at least one produced image of the photomask, and/or determining a dimension of the one or more structures on the basis of the determined contour. The processing of data can include determining a deviation of the determined contour from a reference contour in reference data and/or a deviation of the determined dimension from a reference dimension in reference data, e.g., for of the at least one second acceleration voltage. The processing of data can include determining an intensity profile of at least one produced image of the photomask and determining a deviation of the determined intensity profile from a reference intensity profile of reference data, e.g., for each of the at least one second acceleration voltage. The processing of data can include determining the deviation of the determined intensity profile from the reference intensity profile for a region of the produced image which includes a contour of one or more structures of the photomask. The processing of data can include determining an extent of a deviation of a parameter from the at least one produced image of the photomask from a reference parameter determined from reference data. The processing of data can include determining whether the determined deviation is less than a predetermined threshold value.

The one or more computers can include one or more data processors for processing data, one or more storage devices for storing data, and/or one or more computer programs including instructions that when executed by the one or more computers cause the one or more computers to carry out the processes. The one or more computers can include one or more input devices, such as a keyboard, a mouse, a touchpad, and/or a voice command input module, and one or more output devices, such as a display, and/or an audio speaker. In some implementations, the one or more computers can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computers can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

In some implementations, the control device 236 can include a programmable logic controller that includes one or more of the following: one or more power supplies, one or more input/output sections, one or more processor sections, and one or more programming sections. In some examples, each of the control device 236, the production device 238, and the determination device 240 can include one or more of the following: one or more data processors, analog circuitry, one or more memory devices (e.g., random access memory and/or read-only memory), one or more non-volatile storage devices (e.g., solid state drives), one or more input/output buffers, one or more clock signal generators, logic gates, and one or more power supplies.

Although the present invention has been described with reference to exemplary embodiments, it is modifiable in various ways.

LIST OF REFERENCE SIGNS

100 Photomask
102 Substrate
104 Coating
106, 106' Structure
108 Image
110 Image
112 Repair shape
114 Wall
116 Recess
118 Projection
120 Residual material
122 Rounded-off corner
124 Undercut
126 Region
128 Volume
130 Volume
132 Volume
134 Volume
136 Region
138 Contour
140 Dimension
142 Dimension
144 Dimension
146 Dimension
148 Reference contour
150 Reference dimension
152 Reference dimension
154 Reference dimension
156 Reference dimension
158 Deviation
160 Intensity profile
162 Intensity profile
164 Intensity profile
166 Line
168 Deviation
170 Reference intensity profiles
172 Reference intensity profiles
174 Reference intensity profiles
176 Graph
178 Graph
180 Graph
200 Apparatus
202 Electron beam
204 Vacuum housing
206 Vacuum pump
208 Sample stage
210 Electron column
212 Electron source
214 Cathode
216 Anode
218 Voltage source
220 Through opening
222 Electron or beam optics
224 Scanning unit
226 Detector
228 Gas provision unit
230 Valve
232 Gas line
234 Computing apparatus
236 Control device
238 Production device
240 Determination device
242 Output device
244 Vacuum environment
A Distance
B1, B2 Structure size
D Defect
EHT1 Acceleration voltage
EHT2 Acceleration voltage
EHT3 Acceleration voltage
EHT4 Acceleration voltage
G Size
H Size
R Reference data
X Direction
Y Direction
Z Direction

What is claimed is:

1. A method for electron beam-induced processing of a defect of a microlithographic photomask, including the steps of:

a) providing an activating electron beam at a first acceleration voltage and a process gas in the region of a defect of the photomask for the purpose of repairing the defect, and b) producing a plurality of images of the photomask, in which the region of the defect is captured at least in part, by providing an electron beam at a plurality of second acceleration voltages which differ from the first acceleration voltage, for the purpose of determining a quality of the repaired defect, wherein the plurality of images of the photomask are produced using the electron beam at a corresponding plurality of the second acceleration voltages which differ from the first acceleration voltage and from one another, for the purpose of acquiring depth information in relation to a structure of the photomask;

wherein an extent of a deviation of a parameter determined from the at least one produced image of the photomask from a reference parameter determined from reference data is determined during the determination of the quality of the repaired defect, and the method comprises determining whether the determined deviation is less than a predetermined threshold value.

2. The method of claim 1, wherein the at least one second acceleration voltage is greater than the first acceleration voltage.

3. The method of claim 1, wherein step b) is carried out in situ in relation to step a).

4. The method of claim 1, wherein steps a) and b) are carried out in a vacuum environment and the photomask remains in the vacuum environment between step a) and step b).

5. The method of claim 1, including the step of:

determining the quality of the repaired defect using an image analysis of the at least one produced image of the photomask and/or on the basis of a comparison of the at least one produced image of the photomask with reference data for the at least one second acceleration voltage.

6. The method of claim 5, including the step of:

generating the reference data using a simulation on the basis of a given model of the photomask, wherein, during the simulation, at least one reference image is produced on the basis of a simulated interaction between an electron beam, which corresponds to the at least one second acceleration voltage, and the given model of the photomask.

7. The method of claim 5, wherein a region outside of the defect is captured in the at least one produced image of the photomask and the method includes the step of:

generating the reference data on the basis of an image analysis of the region outside of the defect.

8. The method of claim 1, wherein the determination of the quality of the repaired defect includes:

a determination of a contour of one or more structures in the at least one produced image of the photomask, and/or a determination of a dimension of the one or more structures on the basis of the determined contour.

9. The method of claim 8, wherein, during the determination of the quality of the repaired defect, a deviation of the determined contour from a reference contour in reference data and/or a deviation of the determined dimension from a reference dimension in reference data are/is determined.

10. The method of claim 9, wherein the deviation of the determined contour from the reference contour in the reference data and/or the deviation of the determined dimension from the reference dimension in the reference data is determined for each of the at least one second acceleration voltage.

11. The method of claim 1, wherein, during the determination of the quality of the repaired defect, an intensity profile of the at least one produced image of the photomask is determined and a deviation of the determined intensity profile from a reference intensity profile of reference data is determined.

12. The method of claim 11, wherein the deviation of the determined intensity profile from the reference intensity profile is determined for a region of the produced image which comprises a contour of one or more structures of the photomask.

13. The method of claim 11, wherein the determined intensity profile is a one-dimensional or a two-dimensional intensity profile.

14. A method for electron beam-induced processing of a defect of a microlithographic photomask, including the steps of:

providing an activating electron beam at a first acceleration voltage and a process gas in the region of a defect of the photomask, and repairing the defect at least in part by use of the process gas activated by the electron beam;

producing a first image of the photomask, in which the region of the defect is captured at least in part, by providing an electron beam at a second acceleration voltage which differs from the first acceleration voltage;

producing a second image of the photomask, in which the region of the defect is captured at least in part, by providing an electron beam at a third acceleration voltage which differs from the first and the second acceleration voltages;

analyzing the first produced image of the photomask to obtain first information about a structure of the photomask at a first depth;

analyzing the second produced image of the photomask to obtain second information about the structure of the photomask at a second depth; and determining the quality of the repaired defect based at least in part on the first and second information about the structure of the photomask at the first and second depths;

wherein an extent of a deviation of a parameter determined from the at least one produced image of the photomask from a reference parameter determined from reference data is determined during the determination of the quality of the repaired defect, and the method comprises determining whether the determined deviation is less than a predetermined threshold value.

15. The method of claim 14, wherein determining the quality of the repaired defect comprises determining the quality of the repaired defect using an image analysis of the first produced image of the photomask and the second produced image of the photomask.

16. The method of claim 14, wherein determining the quality of the repaired defect comprises determining the quality of the repaired defect on the basis of a comparison of the first produced image of the photomask with reference data for the second acceleration voltage, and a comparison of the second produced image of the photomask with reference data for the third acceleration voltage.

17. The method of claim 14, comprising producing at least a third image of the photomask, in which the region of the defect is captured at least in part, by providing an electron beam at at least one fourth acceleration voltage which differs from the first, second, and third acceleration voltages;

analyzing the at least one third produced image of the photomask to obtain at least one third information about the structure of the photomask at at least a third depth; and determining the quality of the repaired defect based at least in part on the first information, the second information, and at least one third information about the structure of the photomask.

18. The method of claim 14, wherein repairing the defect by use of the process gas activated by the electron beam, producing the first image of the photomask, producing the second image of the photomask are carried out in a vacuum environment;

wherein the photomask remains in the vacuum environment after repairing the defect and before producing the first image; and wherein the photomask remains in the vacuum environment after producing the first image and before producing the second image.

19. A method for electron beam-induced processing of a defect of a microlithographic photomask, including the steps of:

a) providing an activating electron beam at a first acceleration voltage and a process gas in the region of a defect of the photomask for the purpose of repairing the defect, and b) producing a plurality of images of the photomask, in which the region of the defect is captured at least in part, by providing an electron beam at a plurality of second acceleration voltages which differ from the first acceleration voltage, for the purpose of determining a quality of the repaired defect, wherein the plurality of images of the photomask are produced using the electron beam at a corresponding plurality of the second acceleration voltages which differ from the first acceleration voltage and from one another, for the purpose of acquiring depth information in relation to a structure of the photomask;

wherein the determination of the quality of the repaired defect includes:

a determination of a contour of one or more structures in the at least one produced image of the photomask, and/or a determination of a dimension of the one or more structures on the basis of the determined contour;

wherein, during the determination of the quality of the repaired defect, a deviation of the determined contour from a reference contour in reference data and/or a deviation of the determined dimension from a reference dimension in reference data are/is determined;

wherein the deviation of the determined contour from the reference contour in the reference data and/or the deviation of the determined dimension from the reference dimension in the reference data is determined for each of the at least one second acceleration voltage.

20. A method for electron beam-induced processing of a defect of a microlithographic photomask, including the steps of:

providing an activating electron beam at a first acceleration voltage and a process gas in the region of a defect of the photomask, and repairing the defect at least in part by use of the process gas activated by the electron beam;

producing a first image of the photomask, in which the region of the defect is captured at least in part, by providing an electron beam at a second acceleration voltage which differs from the first acceleration voltage;

producing a second image of the photomask, in which the region of the defect is captured at least in part, by providing an electron beam at a third acceleration voltage which differs from the first and the second acceleration voltages;

analyzing the first produced image of the photomask to obtain first information about a structure of the photomask at a first depth;

analyzing the second produced image of the photomask to obtain second information about the structure of the photomask at a second depth; and determining the quality of the repaired defect based at least in part on the first and second information about the structure of the photomask at the first and second depths;

wherein the determination of the quality of the repaired defect includes:

a determination of a contour of one or more structures in the at least one produced image of the photomask, and/or a determination of a dimension of the one or more structures on the basis of the determined contour;

wherein, during the determination of the quality of the repaired defect, a deviation of the determined contour from a reference contour in reference data and/or a deviation of the determined dimension from a reference dimension in reference data are/is determined;

wherein the deviation of the determined contour from the reference contour in the reference data and/or the deviation of the determined dimension from the reference dimension in the reference data is determined for each of the second and third acceleration voltages.

* * * * *